United States Patent
Liu (10) Patent No.: US 10,043,426 B2
(45) Date of Patent: Aug. 7, 2018

(54) LIQUID CRYSTAL PANELS, TFT SUBSTRATES, AND THE DETECTION METHODS THEREOF

(71) Applicant: Shenzhen China Star Optoelectronics Technology Co., Ltd., Shenzhen, Guangdong (CN)

(72) Inventor: Huan Liu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 230 days.

(21) Appl. No.: 14/783,771

(22) PCT Filed: Aug. 12, 2015

(86) PCT No.: PCT/CN2015/086739
§ 371 (c)(1),
(2) Date: Oct. 9, 2015

(87) PCT Pub. No.: WO2017/024548
PCT Pub. Date: Feb. 16, 2017

(65) Prior Publication Data
US 2017/0169745 A1    Jun. 15, 2017

(30) Foreign Application Priority Data
Aug. 7, 2015 (CN) .......................... 2015 1 0483335

(51) Int. Cl.
G09G 3/36    (2006.01)
G09G 3/00    (2006.01)
(Continued)

(52) U.S. Cl.
CPC ........... *G09G 3/006* (2013.01); *G02F 1/1368* (2013.01); *G02F 1/136286* (2013.01);
(Continued)

(58) Field of Classification Search
CPC .... G09G 3/3266; G09G 3/364; G09G 3/3659; G09G 3/3674–3/3681; G09G 2310/02–2310/0216
See application file for complete search history.

(56) References Cited

U.S. PATENT DOCUMENTS

2004/0263710 A1    12/2004  Song et al.
2006/0186913 A1*   8/2006   Kim ...................... G09G 3/006
                                                     324/760.02
(Continued)

Primary Examiner — Sanghyuk Park
(74) Attorney, Agent, or Firm — Andrew C. Cheng (57) ABSTRACT

A liquid crystal panel, a TFT substrate, and a detection method for TFT substrates are disclosed. The TFT substrate includes a plurality of pixel cells. The secondary pixel area of the first pixel cell in the (2n+1)-th row electrically connects to the capacitor of the second pixel cell in the (2n+2)-th row, and the secondary pixel area of the first pixel cell in the (2n+2)-th row electrically connects to the capacitor of the first pixel cell in the (2n+1)-th row. Different voltage signals are respectively provided to the first pixel cell and the second pixel cell. In this way, the short-circuit between the capacitor and the secondary pixel area within the same pixel cell may be detected, and thus may be repaired in time so as to enhance the product reliability.

9 Claims, 4 Drawing Sheets (51) Int. Cl.
*G02F 1/1368* (2006.01)
*G02F 1/1362* (2006.01)

(52) U.S. Cl.
CPC ............. *G09G 3/3677* (2013.01); *G02F 2001/136254* (2013.01); *G09G 2300/0842* (2013.01); *G09G 2320/0233* (2013.01); *G09G 2330/12* (2013.01)

(56) References Cited

U.S. PATENT DOCUMENTS

| | | |
|---|---|---|
| 2009/0244419 A1 | 10/2009 | Nakamura et al. |
| 2010/0066658 A1* | 3/2010 | Kim ............. G09G 3/3659 345/98 |
| 2013/0100106 A1 | 4/2013 | Wu et al. |
| 2015/0103063 A1 | 4/2015 | Ye et al. |
| 2015/0170595 A1 | 6/2015 | Chen et al. |
| 2016/0033833 A1 | 2/2016 | Lin et al. |
| 2016/0238914 A1 | 8/2016 | Wang |

* cited by examiner

LIQUID CRYSTAL PANELS, TFT SUBSTRATES, AND THE DETECTION METHODS THEREOF

BACKGROUND OF THE INVENTION

1. Field of the Invention

The present disclosure relates to liquid crystal display technology, and more particularly to a liquid crystal panel, a TFT substrate, and the detection method thereof.

2. Discussion of the Related Art

Figure 1:
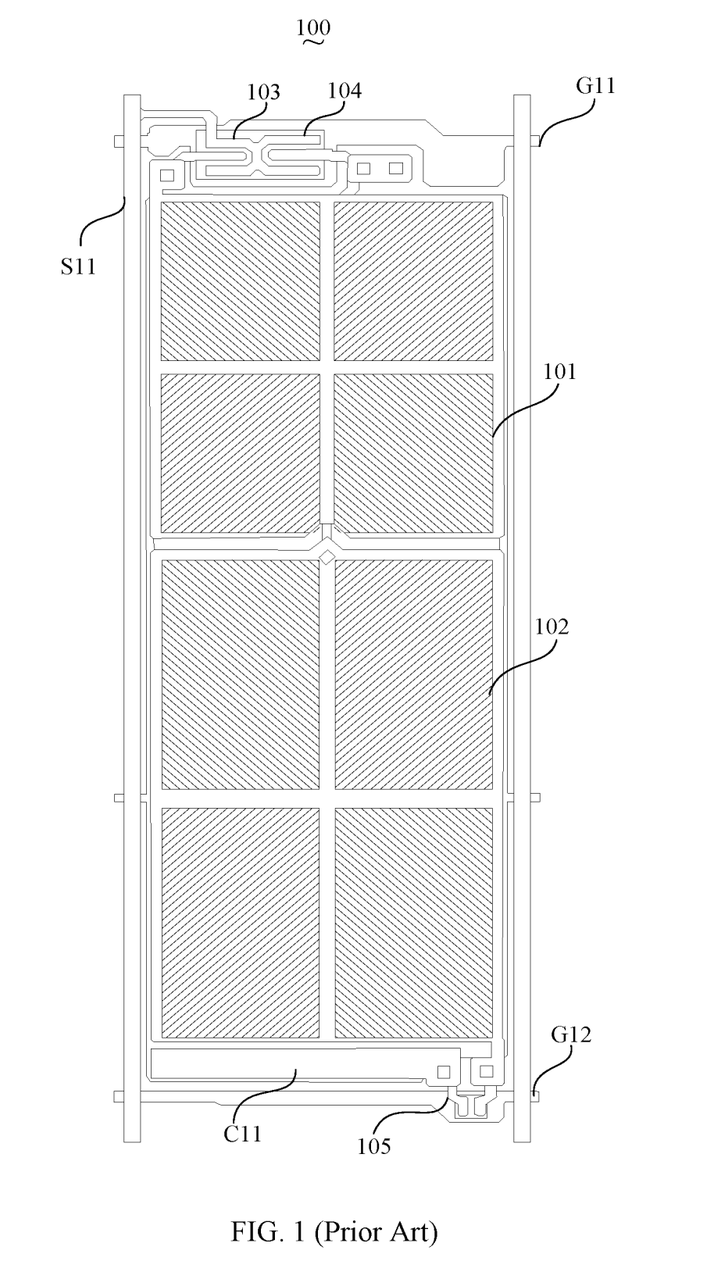
FIG. 1 is a schematic view of a conventional pixel cell.

For liquid crystal devices with large viewing angle, usually, the pixel cell is divided into a main pixel area (Main area) and a secondary pixel area (Sub area), and the voltage of the Sub area is lower than that of the Main area. Charge-sharing is a common solution to obtain such configuration. FIG. 1 is a schematic view of a conventional pixel cell. Referring to FIG. 1, the pixel cell 100 includes a main area 101 and a sub area 102. When the scanning line (G11) provides the scanning driving signals, the transistors 103, 104 are turned on at the same time. The signal line (S11, Data) charges the pixel electrodes in the main area 101 and the sub area 102, which is indium tin oxide (ITO) film. Afterward, the scanning line (G11) stops providing the scanning driving signals. The shared scanning line (G12) provides the scanning driving signals, and the transistor 105 is turned on. The voltage-dividing capacitor (C11) connects with the pixel electrodes within the sub area 102 to share the charges of the pixel electrodes within the sub area 102 such that the voltage of the pixel electrodes within the sub area 102 may be decreased to an appropriate level In this way, the pixel electrodes in the sub area 102 may be displayed together with that of the main area 101 so as to enhance the large viewing-angle performance.

The pixel cell 100 of FIG. 1 is manufactured by 4Mask process. The voltage-dividing capacitor (C11) usually adopt MII capacitor structure. That is, the structure of the voltage-dividing capacitor (C11) includes M1 (layer-one metal), G-SiNx, Pa-SiNx, and ITO conductive film. However, with respect to the pixel cell having the MII capacitor structure, residual ITO may occur due to the ITO particle during the manufacturing process, which may results in that ITO within the sub area 102 and the ITO of the voltage-dividing capacitor (C11) are short-connected. As such, when the scanning line (G11) provides the scanning driving signals, the data line (S11) charges the pixel electrodes in the sub area 102 and the main area 101, and the voltage-dividing capacitor (C11) at the same time. When the scanning line (G11) stops providing the scanning driving signals, the common scanning line (G12) provides the scanning driving signals. As the level of the ITO of the voltage-dividing capacitor (C11) and that of the ITO of the sub area 102 are the same, the voltage-dividing capacitor (C11) may not share the charges within the sub area 102. This results in that the level of the sub area 102 may not be divided and so as to be lower down. That is, the large viewing-angle effect may not be generated. In addition, this may result in a higher brightness for the defective pixels such that the micro-bright spots may occur for medium-low grayscale, which affects the performance of the liquid crystal panel.

SUMMARY

The present disclosure relates to a liquid crystal panel, a TFT substrate, and the detection method for detecting short-circuit between the capacitor and the main pixel area or the secondary pixel area. In this way, the short-circuit may be repaired in time so as to enhance the product reliability.

In one aspect, a TFT substrate includes: a plurality of pixel cells being arranged in a matrix, each of the pixel cells comprising a main pixel area, a secondary pixel area, and a capacitor, the pixel cells comprising a first pixel cell in odd row and a second pixel cell in even row; the secondary pixel area of the first pixel cell in the (2n+1)-th row electrically connecting to the capacitor of the second pixel cell in the (2n+2)-th row, and the secondary pixel area of the first pixel cell in the (2n+2)-th row electrically connecting to the capacitor of the first pixel cell in the (2n+1)-th row, wherein n is a natural number; and wherein different voltage signals being provided to the first pixel cell and the second pixel cell to detect short-circuit between the capacitor and the main pixel area or the secondary pixel area within the same pixel cell.

Wherein the secondary pixel area of the first pixel cell in the (2n+1)-th row is close to the secondary pixel area of the second pixel cell in the (2n+2)-th row, and the main pixel area of the first pixel cell in the (2n+1)-th row is far away from the main pixel area of the second pixel cell in the (2n+2)-th row; and the capacitor of the first pixel cell in the (2n+1)-th row is arranged between the secondary pixel area and the second pixel cell in the (2n+2)-th row, and the capacitor of the second pixel cell in the (2n+2)-th row is arranged between the secondary pixel area and the first pixel cell in the (2n+1)-th row.

Wherein the voltage signals received by the main pixel area and the secondary pixel area of the pixel cells in the same row are the same.

Wherein the TFT substrate comprises first scanning lines, second scanning lines, shared scanning lines, and first TFTs, and second TFTs, wherein: the first scanning line electrically connects to the first pixel cell; the second scanning line electrically connects to the second pixel cell; the first TFT electrically connects to the shared scanning line, the secondary pixel area of the first pixel cell in the (2n+1)-th row, and the capacitor of the second pixel cell in the (2n+2)-th row, respectively; the second TFT electrically connects to the shared scanning line, the secondary pixel area of the second pixel cell in the (2n+2)-th row, and the capacitor of the first pixel cell in the (2n+1)-th row, respectively; and the shared scanning line electrically connects to the first scanning line to provide the scanning driving signals to the first scanning line such that and the first TFT and the second TFT on the same shared scanning line are turned on.

Wherein the scanning driving signals are provided to the first scanning lines and the second scanning lines in a time division manner.

Wherein a difference between the voltage signals provided to the first pixel cell and to the second pixel cell is larger than or equal to 6V.

In another aspect, a liquid crystal panel includes: a TFT substrate a plurality of pixel cells being arranged in a matrix, each of the pixel cells comprising a main pixel area, a secondary pixel area, and a capacitor, the pixel cells comprising a first pixel cell in odd row and a second pixel cell in even row; the secondary pixel area of the first pixel cell in the (2n+1)-th row electrically connecting to the capacitor of the second pixel cell in the (2n+2)-th row, and the secondary pixel area of the first pixel cell in the (2n+2)-th row electrically connecting to the capacitor of the first pixel cell in the (2n+1)-th row, wherein n is a natural number; and wherein different voltage signals being provided to the first pixel cell and the second pixel cell to detect short-circuit between the capacitor and the main pixel area or the secondary pixel area within the same pixel cell.

Wherein the secondary pixel area of the first pixel cell in the (2n+1)-th row is close to the secondary pixel area of the second pixel cell in the (2n+2)-th row, and the main pixel area of the first pixel cell in the (2n+1)-th row is far away from the main pixel area of the second pixel cell in the (2n+2)-th row; and the capacitor of the first pixel cell in the (2n+1)-th row is arranged between the secondary pixel area and the second pixel cell in the (2n+2)-th row, and the capacitor of the second pixel cell in the (2n+2)-th row is arranged between the secondary pixel area and the first pixel cell in the (2n+1)-th row.

Wherein the voltage signals received by the main pixel area and the secondary pixel area of the pixel cells in the same row are the same.

Wherein the TFT substrate comprises first scanning lines, second scanning lines, shared scanning lines, and first TFTs, and second TFTs, wherein: the first scanning line electrically connects to the first pixel cell; the second scanning line electrically connects to the second pixel cell; the first TFT electrically connects to the shared scanning line, the secondary pixel area of the first pixel cell in the (2n+1)-th row, and the capacitor of the second pixel cell in the (2n+2)-th row, respectively; the second TFT electrically connects to the shared scanning line, the secondary pixel area of the second pixel cell in the (2n+2)-th row, and the capacitor of the first pixel cell in the (2n+1)-th row, respectively; and the shared scanning line electrically connects to the first scanning line to provide the scanning driving signals to the first scanning line such that and the first TFT and the second TFT on the same shared scanning line are turned on.

Wherein the scanning driving signals are provided to the first scanning lines and the second scanning lines in a time division manner.

Wherein a difference between the voltage signals provided to the first pixel cell and to the second pixel cell is larger than or equal to 6V.

In another aspect, a detection method for TFT substrates includes: the TFT substrate comprising a plurality of pixel cells being arranged in a matrix, each of the pixel cells comprising a main pixel area, a secondary pixel area, and a capacitor, the pixel cells comprising a first pixel cell in odd row and a second pixel cell in even row; the TFT substrate comprises first scanning lines, second scanning lines, shared scanning lines, and first TFTs, and second TFTs, wherein: the first scanning line electrically connects to the first pixel cell; the second scanning line electrically connects to the second pixel cell; the first TFT electrically connects to the shared scanning line, the secondary pixel area of the first pixel cell in the (2n+1)-th row, and the capacitor of the second pixel cell in the (2n+2)-th row, respectively; the second TFT electrically connects to the shared scanning line, the secondary pixel area of the second pixel cell in the (2n+2)-th row, and the capacitor of the first pixel cell in the (2n+1)-th row, respectively; and providing scanning driving signals to the second pixel cell so as to provide the voltage signals to the second pixel cell; providing scanning driving signals to the first pixel cell so as to provide voltage signals to the first pixel cell to turn on the first transistor and the second transistor, the voltage signals are different from that being provided to the second pixel cell, the secondary pixel area of the first pixel cell in the (2n+1)-th row electrically connecting to the capacitor of the second pixel cell in the (2n+2)-th row via the first transistor, and the secondary pixel area of the second pixel cell in the (2n+2)-th row electrically connecting to the capacitor of the first pixel cell in the (2n+1)-th row via the second transistor, wherein n is a natural number, and wherein different voltage signals being provided to the first pixel cell and the second pixel cell to detect short-circuit between the capacitor and the main pixel area or the secondary pixel area within the same pixel cell, and the voltage signals received by the main pixel area and the secondary pixel area of the pixel cells in the same row are the same; detecting whether the voltage of the secondary pixel area of the second pixel cell has changed to determine whether the capacitor and the main pixel area or the secondary pixel area within the same pixel cell is short-connected, when the voltage signals of the secondary pixel area of the second pixel cell has changed, it is determined that the capacitor and the main pixel cell or the secondary pixel cell is short-connected; and the shared scanning line electrically connects to the first scanning line to provide the scanning driving signals to the first scanning line such that and the first TFT and the second TFT on the same shared scanning line are turned on.

Wherein before the step of providing the scanning driving signals to the first pixel cell, the method further comprises:

stopping providing the scanning driving signals to the second pixel cell.

Wherein a difference between the voltage signals provided to the first pixel cell and to the second pixel cell is larger than or equal to 6V.

In view of the above, the TFT substrate includes a plurality of pixel cells being arranged in a matrix. Each of the pixel cells includes a main pixel area, a secondary pixel area, and a capacitor. The pixel cells include a first pixel cell in odd row and a second pixel cell in even row. The secondary pixel area of the first pixel cell in the (2n+1)-th row electrically connects to the capacitor of the second pixel cell in the (2n+2)-th row, and the secondary pixel area of the first pixel cell in the (2n+2)-th row electrically connects to the capacitor of the first pixel cell in the (2n+1)-th row, wherein n is a natural number. Different voltage signals are provided to the first pixel cell and the second pixel cell to detect short-circuit between the capacitor and the main pixel area or the secondary pixel area within the same pixel cell. In this way, the short-circuit between the capacitor and the secondary pixel area within the same pixel cell may be detected, and thus may be repaired in time so as to enhance the product reliability.

DETAILED DESCRIPTION OF THE EMBODIMENTS

Embodiments of the invention will now be described more fully hereinafter with reference to the accompanying drawings, in which embodiments of the invention are shown.

Figure 2:
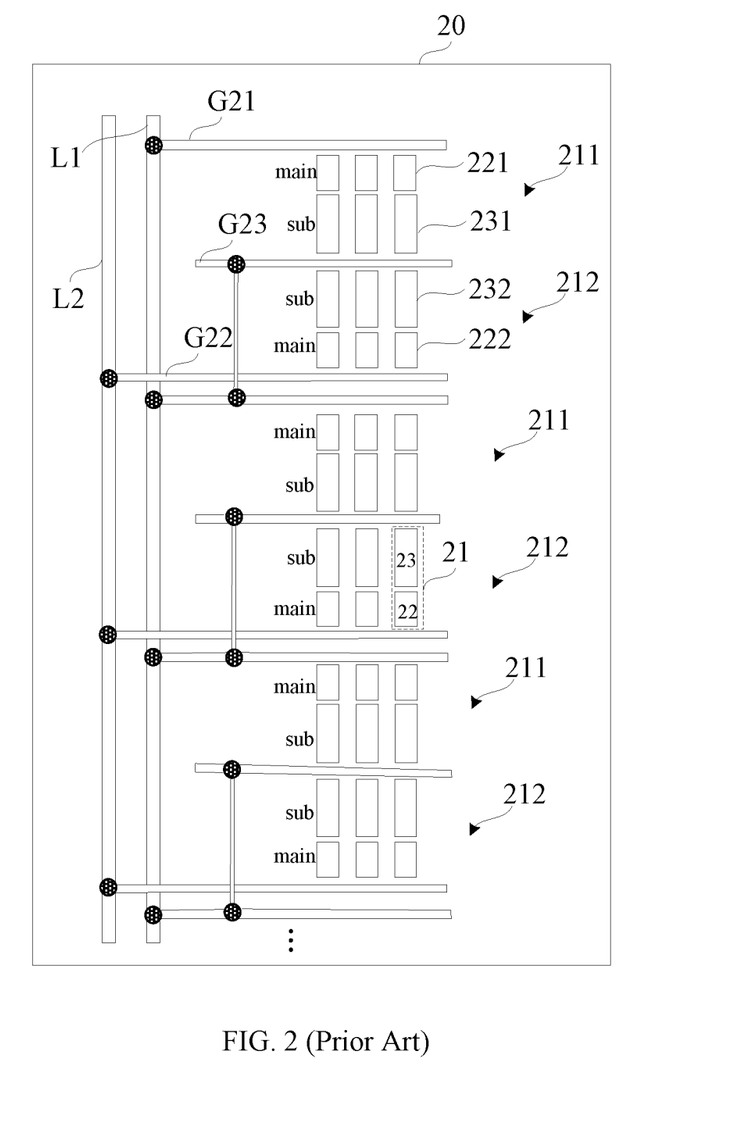
FIG. 2 is a schematic view of the liquid crystal panel in accordance with one embodiment.
Figure 3:
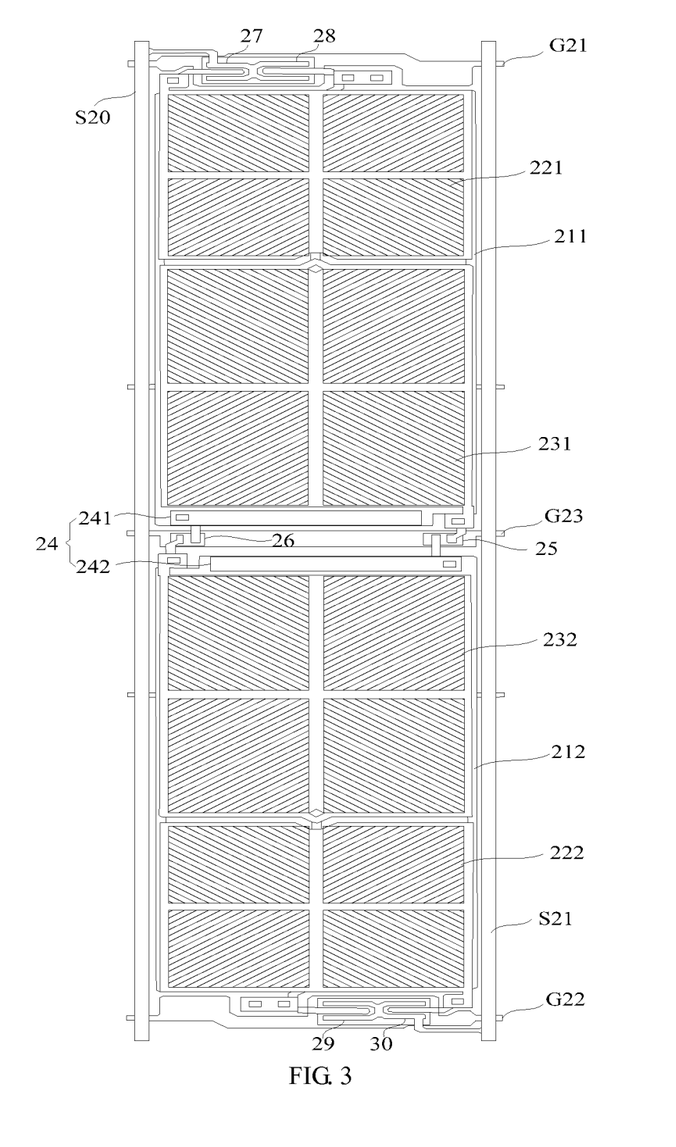
FIG. 3 is a schematic view of the pixel cells of two adjacent rows of the liquid crystal panel of FIG. 2.

FIG. 2 is a schematic view of the liquid crystal panel in accordance with one embodiment. FIG. 3 is a schematic view of the pixel cells of two adjacent columns of the liquid crystal panel of FIG. 2. As shown in FIGS. 2 and 3, the liquid crystal panel 200 includes a thin film transistor (TFT)

substrate 200 having a plurality of pixel cells 21 arranged in a matrix. Each of the pixel cells 21 includes a main pixel area 22, a secondary pixel area 23, and a capacitor 24.

The pixel cells 21 includes a first pixel cell 211 in odd row and a second pixel cell 212 in even row. In the embodiment, the odd number is represented by 2n+1, the even number is represented by 2n+2, and n is a natural number, such as 0, 1, 2, 3 . . . , and n. In the embodiment, the secondary pixel area 231 of the first pixel cell 211 in the (2n+1)-th row electrically connects to the capacitor 242 of the second pixel cell 212 in the (2n+2)-th row. The secondary pixel area 232 of the first pixel cell 212 in the (2n+2)-th row electrically connects to the capacitor 241 of the first pixel cell 211 in the (2n+1)-th row.

Preferably, the secondary pixel area 231 of the first pixel cell 211 in the (2n+1)-th row is close to the secondary pixel area 232 of the second pixel cell 212 in the (2n+2)-th row, and the main pixel area 221 of the first pixel cell 211 in the (2n+1)-th row is far away from the main pixel area 222 of the second pixel cell 212 in the (2n+2)-th row. That is, the arrangement of the first pixel cell 211 in the (2n+1)-th row is opposite to the arrangement of the second pixel cell 212 in the (2n+2)-th row. For instance, as shown in FIG. 2, the secondary pixel area 231 of the first pixel cell 211 is close to the secondary pixel area 232 of the second pixel cell 212, and the main pixel area 221 of the first pixel cell 211 is far away from the main pixel area 222 of the second pixel cell 212. Similarly, the pixel cells in other rows are arranged in the same way.

In addition, as shown in FIG. 3, the capacitor 241 of the first pixel cell 211 in the (2n+1)-th row is arranged between the secondary pixel area 231 and the second pixel cell 212 in the (2n+2)-th row. The capacitor 242 of the second pixel cell 212 in the (2n+2)-th row is arranged between the secondary pixel area 232 and the first pixel cell 211 in the (2n+1)-th row. Thus, the secondary pixel area 231 is adjacent to the capacitor 241, the secondary pixel area 232 is adjacent to the capacitor 242, and the two capacitors 241, 242 are arranged between the secondary pixel areas 231, 232.

In other embodiments, the arrangements of the first pixel cell 211 and the second pixel cell 212 may be the same. In addition, the capacitors 241, 242 are respectively adjacent to the main pixel area 221 of the first pixel cell 211 and the main pixel area 222 of the second pixel cell 212.

The voltage signals provided to the main pixel area and the secondary pixel area of the pixel cells in the same row are the same. In addition, the voltage signals provided to the first pixel cell 211 is different from the voltage signals provided to the second pixel cell 212 so as to detect short-circuit between the capacitor and the main pixel area or the secondary pixel area within the same pixel cell. Preferably, the difference between the voltage signals provided to the first pixel cell 211 and to the second pixel cell 212 is larger than or equal to 6V. The circuit structure will be described in detail hereinafter.

The TFT substrate 20 includes a plurality of first scanning lines (G21) parallel to each other, second scanning lines (G22), shared scanning lines (G23), a first data line (S20), a second data line (S21), and transistors 25, 25, 27, 28, 29, and 30.

The number of the first scanning lines (G21) is the same with the number of rows of the first pixel cells 211. The number of the first data lines (S20) is the same with the number of the columns of the first pixel cells 211. Each of the first scanning lines (G21) electrically connects to the first pixel cells 211 in the corresponding row. Each of the data lines (S20) electrically connects to the first pixel cells 211 in the corresponding column. Specifically, as shown in FIG. 3, the first scanning lines (G21) electrically connect to control ends of the transistors 27, 28, the first data lines (S20) electrically connect to input ends of the transistors 27, 28, and output ends of the transistors 27, 28 electrically connect to the main pixel area 221 and the secondary pixel area 231 of the first pixel cell 211, respectively. It can be understood that the output ends of the transistors 27, 28 electrically connect to ITO electrodes of the main pixel area 221 and the secondary pixel area 231, respectively. When the first scanning lines (G21) provides scanning driving signals, the transistors 27, 28 are turned on at the same time, and the input ends and the output ends of the transistors 27, 28 are connected with each other. The voltage signals provided by the data lines (S20) pass through the input ends and the output ends, and are then respectively provided to the main pixel area 221 and the secondary pixel area 231 so as to charge the main pixel area 221 and the secondary pixel area 231.

As shown in FIG. 2, when detecting the short-circuit on the TFT substrate 20, all of the first scanning lines (G21) are connected to the same shorting bar (L1). In this way, the scanning driving signals are provided to the first scanning lines (G21) at the same time so as to turn on the transistors 27, 28 of the first pixel cell 211, and thus the main pixel area 221 and the secondary pixel area 231 of the first pixel cell 211 are charged.

It can be understood that when detecting the short-circuit on the TFT substrate 20, all of the first data line (S20) may be connected on the same shorting bar so as to provide the same voltage signals to the first pixel cell 211.

The number of the second scanning lines (G22) is the same with the number of columns of the second pixel cells 212. The number of the data lines (S21) is the same with the number of the columns of the second pixel cells 212.

Each of the second scanning lines (G22) electrically connects to the second pixel cells 212 in the corresponding row. Each of the data lines (S21) electrically connects to the second pixel cells 212 in the corresponding column.

Specifically, as shown in FIG. 3, the second scanning lines (G22) electrically connects with the control ends of the transistors 29, 30, the data line (S21) electrically connect with the input ends of the transistors 29, 30, and the output ends of the transistors 29, 30 electrically connect with the main pixel area 222 and the secondary pixel area 232, respectively. It can be understood that the output ends of the transistors 27, 28 electrically connect to ITO electrodes of the main pixel area 221 and the secondary pixel area 231, respectively. When the second scanning lines (G22) provides scanning driving signals, the transistors 29, 30 are turned on at the same time, and the input ends and the output ends of the transistors 29, 30 are connected with each other. The voltage signals provided by the data lines (S21) pass through the input ends and the output ends, and are then respectively provided to the main pixel area 221 and the secondary pixel area 231 so as to charge the main pixel area 221 and the secondary pixel area 231.

As shown in FIG. 2, when detecting the short-circuit on the TFT substrate 20, all of the second scanning lines (G22) are connected to the same shorting bar (L2). In this way, the scanning driving signals are provided to the second scanning lines (G22) at the same time so as to turn on the transistors 29, 30 of the second pixel cell 212, and thus the main pixel area 222 and the secondary pixel area 232 of second pixel cell 212 are charged.

It can be understood that when detecting the short-circuit on the TFT substrate 20, all of the second data line (S21) may be connected on the same shorting bar so as to provide the same voltage signals to the second pixel cell 212.

The shared scanning lines (G23) are arranged between the first pixel cell 211 and the second pixel cell 212. In addition, the g23 In addition, the shared scanning lines (G23) electrically connects with the first scanning lines (G21). Specifically, the shared scanning lines (G23) electrically connects with the first scanning lines (G21) adjacent to the shared scanning lines (G23). During normal operations, which means not during detecting stages, the shared scanning lines (G23) connects to the first scanning lines (G21) providing the scanning driving signals, and the first scanning lines (G21) is located farther.

The transistor 25 electrically connects to the shared scanning lines (G23), the main pixel area 213 of the first pixel cell 211 in the (2n+1)-th row, and the capacitor 242 of the second pixel cell 212 in the (2n+2)-th row, respectively. Specifically, the number of the transistors 25 is the same with the number of the capacitors 241 of the first pixel cell 211. The control ends of the each of the transistors 25 electrically connect to one shared scanning line (G23), the input ends and the output ends of each of the transistors 25 electrically connect to the main pixel area 213 of the first pixel cell 211 and the capacitor 242 of the second pixel cell 212 arranged at two lateral sides of the shared scanning lines (G23).

The second transistor 26 electrically connects to the shared scanning lines (G23), the secondary pixel area 232 of the second pixel cell 212 in the (2n+2)-th row, and the capacitor 241 of the first pixel cell 211 in the (2n+1)-th row, respectively. Specifically, the number of the transistors 26 is the same with the number of the capacitors 242 of the second pixel cell 212. The control ends of the each of the transistors 26 electrically connect to one shared scanning line (G23), the input ends and the output ends of each of the transistors 26 electrically connect to the secondary pixel area 232 of the second pixel cell 212 and the capacitor 241 of the first pixel cell 211 arranged at two lateral sides of the shared scanning lines (G23).

It is to be noted that, as shown in FIG. 3, the transistors 25, 26 respectively corresponding to the two adjacent capacitors 241, 242 share the same shared scanning lines (G23). Thus, the number of the shared scanning lines is reduced, which increases the aperture rate of the pixel cell so as to enhance the transmission rate of the liquid crystal panel 200.

In other embodiments, the transistors 25, 26 may respectively connects to one shared scanning line (G23) without considering the transmission rate.

The control end of the above transistor is the gate of the transistor, the input end of the above transistor is one of the source or the drain of the transistor, and the output end of the above transistor is one of the source or the drain of the transistor.

The detecting principles of the TFT substrate 20 will be described hereinafter.

The scanning driving signals are provided to the first scanning lines (G21) and the second scanning lines (G22) in a time division manner.

FIG. 2 is an example showing the arrangement of the first pixel cell 211 is opposite to that of the second pixel cell 212. First, high-level signals are provided to the shorting bar (L2), and low-level signals are provided to the shorting bar (L1). Thus, the second scanning lines (G22) of the second pixel cell 212 in the even row receive the scanning driving signals so as to turn on the transistors 29, 30. The data line (S21) provides the voltage signals to the corresponding main pixel area 222 and the secondary pixel area 232. For instance, the provided voltage signals equal to 1V, and thus the pixel voltage of 1V is written to the main pixel area 222 and the secondary pixel area 232 of the second pixel cell 212. Afterward, the shorting bar (L2) is provided with the low-level signals to turn off the transistors 29, 30, which stops charging the main pixel area 222 and the secondary pixel area 232.

Afterward, the high-level signals is provided to the shorting bar (L1), and thus the first scanning lines (G21) of the first pixel cell 211 in the odd row receives the scanning driving signals so as to turn on the transistors 27, 28. The first data line (S20) provides the voltage signals to the corresponding main pixel area 221 and the secondary pixel area 231. For instance, the provided voltage signals equal to 16V, and thus the pixel voltage of 16V is written to the main pixel area 221 and the secondary pixel area 231 of the first pixel cell 211.

It is to be noted that the shared scanning lines (G23) receive the scanning driving signals. Thus, the transistors 25, 26 are turned such that the capacitors 241, 242 are respectively charged.

Specifically, if the secondary pixel areas and the capacitors of the first pixel cell 211 and the second pixel cell 212 have no short-circuit, the capacitor 241 divides the voltage of the secondary pixel area 232 of the second pixel cell 212. That is, the voltage of 1V of the secondary pixel area 232 is divided. The capacitor 242 obtains the voltage signals from the first data line (S20) via the secondary pixel area 231. The capacitor 242 obtains the same voltage of 16V with the secondary pixel area 231 of the first pixel cell 211.

If at least one short-circuit occurs between the secondary pixel area and the capacitor of at least one of the first pixel cell 211 and the second pixel cell 212, the secondary pixel area 232 of the second pixel cell 212 is charged by the first data line (S20) via the short-connected capacitor. Thus, the voltage of 1V of the secondary pixel area 232 becomes 16V. Specifically, if the secondary pixel area 232 and the capacitor 242 of the second pixel cell 212 is short-connected, the capacitor 242 of the secondary pixel area 232 electrically connect with the secondary pixel area 231 of the first pixel cell 211, which results in that the first data line (S20) writes the voltage signals of 16V to the secondary pixel area 232 via the short-connected capacitor 242. Similarly, if the secondary pixel area 231 and the capacitor 241 of the first pixel cell 211 is short-connected, the capacitor 241 of the secondary pixel area 231 and the secondary pixel area 232 of the second pixel cell 212 are electrically connected, which results in the data line (S20) writes the voltage signals of 16V to the secondary pixel area 232. It can be seen that regardless the short-circuit is between the secondary pixel area 231 and the capacitor 241 of the first pixel cell 211 or the secondary pixel area 232 and the capacitor 242 of the second pixel cell 212, the voltage of the secondary pixel area 232 of the second pixel cell 212 in even row changes from 1V to 16V. The difference between the voltage change may be detected by array test. Thus, the circuit structure is capable of detecting the short-circuit between the secondary pixel area and the capacitor of the pixel cell when the array test is performed. In this way, the defects of the pixel cell may be detected in time.

In view of the above, the high-level signals and the low-level signals are provided to the first pixel cell 211 and the second pixel cell 212 in the time-division manner so as to detect the short-circuit between the secondary pixel area and the main pixel area of the pixel cell. In short, by detecting whether the voltage of the secondary pixel area 232 of the second pixel cell 212 is changed, the short-circuit between the capacitor and the secondary pixel area within the same pixel cell may be detected. When detecting the voltage of the secondary pixel area 232 of the second pixel cell 212 has changed, it is determined that the capacitor and the secondary pixel area within the same pixel cell is short-connected. On the contrary, if the voltage of the secondary pixel area 232 of the second pixel cell 212 remains the same, it is determined that the capacitor and the secondary pixel area within the same pixel cell is not short-connected.

In other embodiments, the voltage signals may be provided only to the first pixel cell 211 or the second pixel cell 212. When the voltage is detected only in corresponding pixel cell, it is determined that the secondary pixel area and the capacitors of the first pixel cell 211 and the second pixel cell 212 are not short-connected. On the contrary, when the voltage is detected in both of the first pixel cell 211 and the second pixel cell 212, it is determined that the secondary pixel area and the capacitors of at least one of the first pixel cell 211 and the second pixel cell 212 are short-connected. It can be understood that the voltage signals is larger than or equal to 6V at this moment. In order to save the cost and simplify the process, one shorting bar may be omitted.

It is to be noted that the shorting bars (L1, L2) are only adopted during the testing stages. During normal display stage, the first scanning lines (G21) and the shorting bar (L1), also the second scanning lines (G22) and the shorting bar (L2), are disconnected.

The arrangement mentioned above is opposite to the arrangement of the first pixel cell 211 and the second pixel cell 212 shown in FIG. 2. It should be understood that the arrangement of the first pixel cell 211 and the second pixel cell 212 are the same. In addition, the capacitors 241, 242 are respectively adjacent to the main pixel area 221 of the first pixel cell 211 and the main pixel area 222 of the second pixel cell 212. The detecting principles are the same. At this moment, it is determined that whether the capacitor and the main pixel area within the same pixel cell is short-connected.

Figure 4:
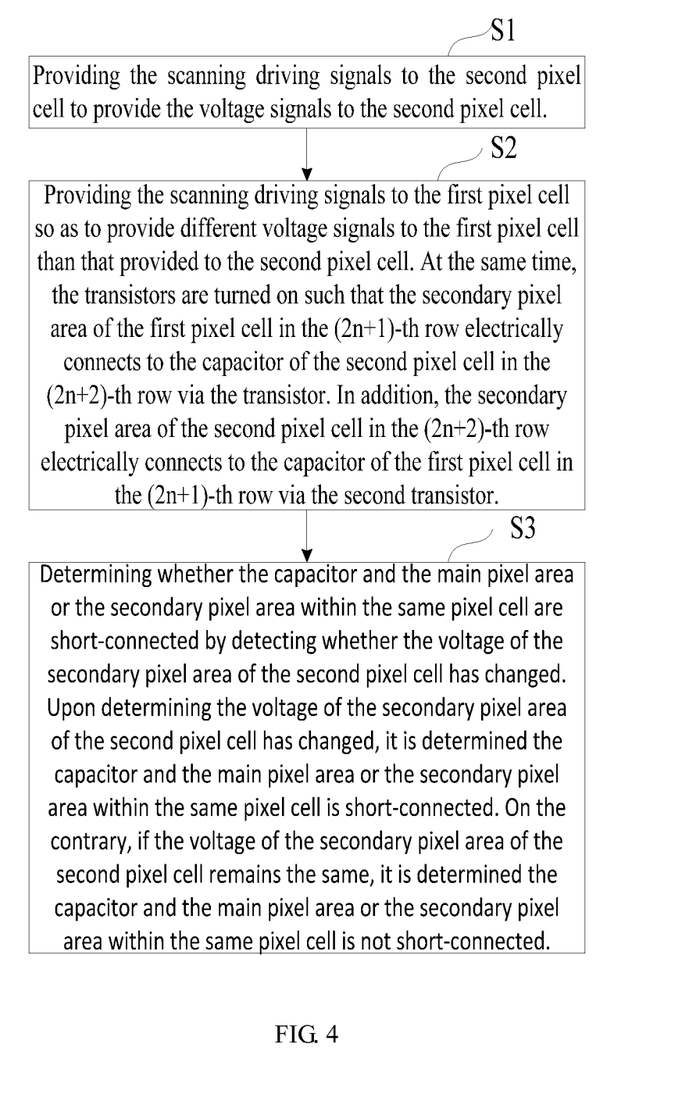
FIG. 4 is a flowchart of a detection method of TFT substrates in accordance with one embodiment.

The present disclosure also introduces a TFT detection method that may be applied to the above TFT substrate 20. FIG. 4 is a flowchart of a detection method of TFT substrates in accordance with one embodiment. The detection method includes the following steps.

In block S1, the scanning driving signals are provided to the second pixel cell 212 so as to provide the voltage signals to the second pixel cell 212.

Specifically, the scanning driving signals are provided to the second scanning lines (G22) to turn on the transistors 29, 30 electrically connected with the second scanning lines (G22). Afterward, the voltage signals are provided to the turned-on transistors 29, 30. As such, the voltage signals are transmitted to the main pixel area 222 and the secondary pixel area 232 of the second pixel cell 212 via the transistors 29, 30, wherein the voltage signals are low-level signals.

In block S2, the scanning driving signals are provided to the first pixel cell 211 so as to provide different voltage signals to the first pixel cell 211 than that provided to the second pixel cell 212. At the same time, the transistors 25, 26 are turned on such that the secondary pixel area 231 of the first pixel cell 211 in the (2n+1)-th row electrically connects to the capacitor 242 of the second pixel cell 212 in the (2n+2)-th row via the transistor 25. In addition, the secondary pixel area 232 of the second pixel cell 212 in the (2n+2)-th row electrically connects to the capacitor 241 of the first pixel cell 211 in the (2n+1)-th row via the second transistor 26.

In block S3, a determination regarding whether the capacitor and the main pixel area or the secondary pixel area within the same pixel cell are short-connected is made by detecting whether the voltage of the secondary pixel area of the second pixel cell 212 has changed. Upon determining the voltage of the secondary pixel area 232 of the second pixel cell 212 has changed, it is determined the capacitor and the main pixel area or the secondary pixel area within the same pixel cell is short-connected. On the contrary, if the voltage of the secondary pixel area 232 of the second pixel cell 212 remains the same, it is determined the capacitor and the main pixel area or the secondary pixel area within the same pixel cell is not short-connected. The detection principles are described in above, and thus are omitted hereinafter.

Under the condition that the capacitors 241, 242 are adjacent to the secondary pixel areas 231, 232, as shown in FIG. 2, the method may detect whether the capacitor and the secondary pixel area within the same pixel cell are short-connected. Under the condition that the capacitors 241, 242 are respectively adjacent to the main pixel areas 221, 222, the method may detect whether the capacitor and the main pixel area within the same pixel cell are short-connected.

Preferably, before the scanning driving signals are provided to the first pixel cell 211 after stopping providing the scanning driving signals to the second pixel cell 212. That is, the scanning driving signals are provided to the first scanning lines (G21) and the second scanning lines (G22) in the time-division manner.

Preferably, the difference between the voltage signals provided to the first pixel cell 211 and to the second pixel cell 212 is larger than or equal to 6V. As stated above, the voltage signals provided to the first pixel cell 211 is 16V, and the voltage signals provided to the second pixel cell 212 is 1V.

It is to be noted that the voltage signals may be provided only to the first pixel cell 211 or the second pixel cell 212. When the voltage is detected only in corresponding pixel cell, it is determined that the secondary pixel area and the capacitors of the first pixel cell 211 and the second pixel cell 212 are not short-connected. On the contrary, when the voltage is detected in both of the first pixel cell 211 and the second pixel cell 212, it is determined that the secondary pixel area and the capacitors of at least one of the first pixel cell 211 and the second pixel cell 212 are short-connected. It can be understood that the voltage signals is larger than or equal to 6V at this moment.

In view of the above, the present disclosure relates to a liquid crystal panel, a TFT substrate, and the detection method for detecting short-circuit between the capacitor and the main pixel area or the secondary pixel area. In this way, the short-circuit may be repaired in time so as to enhance the product reliability.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:
1. A TFT substrate, comprising:
a plurality of pixel cells being arranged in a matrix, each of the pixel cells comprising a main pixel area, a secondary pixel area, and a capacitor, the pixel cells comprising a first pixel cell in odd row and a second pixel cell in even row;

the secondary pixel area of the first pixel cell in the (2n+1)-th row electrically connecting to the capacitor of the second pixel cell in the (2n+2)-th row, and the secondary pixel area of the second pixel cell in the (2n+2)-th row electrically connecting to the capacitor of the first pixel cell in the (2n+1)-th row, wherein n is a natural number; and wherein different voltage signals being provided to the first pixel cell and the second pixel cell to detect short-circuit between the capacitor and the main pixel area or the secondary pixel area within the same pixel cell; and wherein the secondary pixel area of the first pixel cell in the (2n+1)-th row is close to the secondary pixel area of the second pixel cell in the (2n+2)-th row, and the main pixel area of the first pixel cell in the (2n+1)-th row is far away from the main pixel area of the second pixel cell in the (2n+2)-th row;

the capacitor of the first pixel cell in the (2n+1)-th row is arranged between the secondary pixel area and the second pixel cell in the (2n+2)-th row, and the capacitor of the second pixel cell in the (2n+2)-th row is arranged between the secondary pixel area and the first pixel cell in the (2n+1)-th row;

wherein the voltage signals received by the main pixel area and the secondary pixel area of the pixel cells in the same row are the same; and wherein the TFT substrate comprises first scanning lines, second scanning lines, shared scanning lines, and first TFTs, and second TFTs, wherein:

the first scanning line electrically connects to the first pixel cell;

the second scanning line electrically connects to the second pixel cell the first TFT electrically connects to the shared scanning line, the secondary pixel area of the first pixel cell in the (2n+1)-th row, and the capacitor of the second pixel cell in the (2n+2)-th row, respectively;

the second TFT electrically connects to the shared scanning line, the secondary pixel area of the second pixel cell in the (2n+2)-th row, and the capacitor of the first pixel cell in the (2n+1)-th row, respectively; and the shared scanning line electrically connects to the first scanning line to provide the scanning driving signals to the first scanning line such that and the first TFT and the second TFT on the same shared scanning line are turned on.

2. The TFT substrate as claimed in claim 1, wherein the scanning driving signals are provided to the first scanning lines and the second scanning lines in a time division manner.

3. The TFT substrate as claimed in claim 1, wherein a difference between the voltage signals provided to the first pixel cell and to the second pixel cell is larger than or equal to 6V.

4. A liquid crystal panel, comprising:

a TFT substrate comprising a plurality of pixel cells being arranged in a matrix, each of the pixel cells comprising a main pixel area, a secondary pixel area, and a capacitor, the pixel cells comprising a first pixel cell in odd row and a second pixel cell in even row;

the secondary pixel area of the first pixel cell in the (2n+1)-th row electrically connecting to the capacitor of the second pixel cell in the (2n+2)-th row, and the secondary pixel area of the second pixel cell in the (2n+2)-th row electrically connecting to the capacitor of the first pixel cell in the (2n+1)-th row, wherein n is a natural number; and wherein different voltage signals being provided to the first pixel cell and the second pixel cell to detect short-circuit between the capacitor and the main pixel area or the secondary pixel area within the same pixel cell;

wherein the secondary pixel area of the first pixel cell in the (2n+1)-th row is close to the secondary pixel area of the second pixel cell in the (2n+2)-th row, and the main pixel area of the first pixel cell in the (2n+1)-th row is far away from the main pixel area of the second pixel cell in the (2n+2)-th row;

wherein the capacitor of the first pixel cell in the (2n+1)-th row is arranged between the secondary pixel area and the second pixel cell in the (2n+2)-th row, and the capacitor of the second pixel cell in the (2n+2)-th row is arranged between the secondary pixel area and the first pixel cell in the (2n+1)-th row;

wherein the voltage signals received by the main pixel area and the secondary pixel area of the pixel cells in the same row are the same; and wherein the TFT substrate comprises —first scanning lines, second scanning lines, shared scanning lines, and first TFTs, and second TFTs, wherein:

the first scanning line electrically connects to the first pixel cell;

the second scanning line electrically connects to the second pixel cell;

the first TFT electrically connects to the shared scanning line, the secondary pixel area of the first pixel cell in the (2n+1)-th row, and the capacitor of the second pixel cell in the (2n+2)-th row, respectively;

the second TFT electrically connects to the shared scanning line, the secondary pixel area of the second pixel cell in the (2n+2)-th row, and the capacitor of the first pixel cell in the (2n+1)-th row, respectively; and the shared scanning line electrically connects to the first scanning line to provide the scanning driving signals to the first scanning line such that and the first TFT and the second TFT on the same shared scanning line are turned on.

5. The liquid crystal panel as claimed in claim 4, wherein the scanning driving signals are provided to the first scanning lines and the second scanning lines in a time division manner.

6. The liquid crystal panel as claimed in claim 4, wherein a difference between the voltage signals provided to the first pixel cell and to the second pixel cell is larger than or equal to 6V.

7. A detection method for TFT substrates, comprising:

the TFT substrate comprising a plurality of pixel cells being arranged in a matrix, each of the pixel cells comprising a main pixel area, a secondary pixel area, and a capacitor, the pixel cells comprising a first pixel cell in odd row and a second pixel cell in even row;

wherein the secondary pixel area of the first pixel cell in the (2n+1)-th row is close to the secondary pixel area of the second pixel cell in the (2n+2)-th row, and the main pixel area of the first pixel cell in the (2n+1)-th row is far away from the main pixel area of the second pixel cell in the (2n+2)-th row;

the TFT substrate comprises first scanning lines, second scanning lines, shared scanning lines, and first TFTs, and second TFTs, wherein: the first scanning line electrically connects to the first pixel cell;

the second scanning line electrically connects to the second pixel cell;

the first TFT electrically connects to the shared scanning line, the secondary pixel area of the first pixel cell in the (2n+1)-th row, and the capacitor of the second pixel cell in the (2n+2)-th row, respectively;

the second TFT electrically connects to the shared scanning line, the secondary pixel area of the second pixel cell in the (2n+2)-th row, and the capacitor of the first pixel cell in the (2n+1)-th row, respectively; and providing scanning driving signals to the second pixel cell so as to provide the voltage signals to the second pixel cell;

providing scanning driving signals to the first pixel cell so as to provide voltage signals to the first pixel cell to turn on the first TFT and the second TFT, the voltage signals are different from that being provided to the second pixel cell, the secondary pixel area of the first pixel cell in the (2n+1)-th row electrically connecting to the capacitor of the second pixel cell in the (2n+2)-th row via the first transistor, and the secondary pixel area of the second pixel cell in the (2n+2)-th row electrically connecting to the capacitor of the first pixel cell in the (2n+1)-th row via the second TFT, wherein n is a natural number, and wherein different voltage signals being provided to the first pixel cell and the second pixel cell to detect short-circuit between the capacitor and the main pixel area or the secondary pixel area within the same pixel cell, and the voltage signals received by the main pixel area and the secondary pixel area of the pixel cells in the same row are the same;

detecting whether the voltage of the secondary pixel area of the second pixel cell has changed to determine whether the capacitor and the main pixel area or the secondary pixel area within the same pixel cell is short-connected, when the voltage signals of the secondary pixel area of the second pixel cell has changed, it is determined that the capacitor and the main pixel cell or the secondary pixel cell is short-connected; and the shared scanning line electrically connects to the first scanning line to provide the scanning driving signals to the first scanning line such that and the first TFT and the second TFT on the same shared scanning line are turned on.

8. The detection method as claimed in claim 7, wherein before the step of providing the scanning driving signals to the first pixel cell, the method further comprises:

stopping providing the scanning driving signals to the second pixel cell.

9. The detection method as claimed in claim 8, wherein a difference between the voltage signals provided to the first pixel cell and to the second pixel cell is larger than or equal to 6V.

* * * * *